United States Patent [19]

Reznik

[11] Patent Number: 5,621,403
[45] Date of Patent: Apr. 15, 1997

[54] DATA COMPRESSION SYSTEM WITH EXPANDING WINDOW

[75] Inventor: Yuriy Reznik, Kiev, Ukraine

[73] Assignee: Programmed Logic Corporation, Somerset, N.J.

[21] Appl. No.: 492,733

[22] Filed: Jun. 20, 1995

[51] Int. Cl.⁶ .................................................. H03M 7/00
[52] U.S. Cl. ............................. 341/51; 341/65; 341/67; 341/106
[58] Field of Search .............................. 341/51, 59, 65, 341/67, 55, 106

[56] References Cited

U.S. PATENT DOCUMENTS

| | | |
|---|---|---|
| 4,122,440 | 10/1978 | Langdon, Jr. et al. |
| 4,701,745 | 10/1987 | Waterworth. |
| 4,811,265 | 3/1989 | Hashimoto et al. |
| 4,890,326 | 12/1989 | Euler. |
| 5,016,009 | 5/1991 | Whiting et al. |
| 5,126,739 | 6/1992 | Whiting et al. |
| 5,140,321 | 8/1992 | Jung. |
| 5,281,967 | 1/1994 | Jung. |
| 5,289,895 | 3/1994 | Takata et al. |
| 5,309,526 | 5/1994 | Pappas et al. |
| 5,339,076 | 8/1994 | Jiang. |
| 5,363,096 | 11/1994 | Duhamel et al. |
| 5,369,605 | 11/1994 | Parks. |
| 5,374,916 | 12/1994 | Chu. |

OTHER PUBLICATIONS

"Putting Data on a Diet"– Authors: Jeffrey Weiss and Doug Schremp; Apr., 1993 edition of the IEEE Spectrum pp. 36–39.

LZB reference described in "Text Compression" by T. Bell, J. Cleary and I. Witten, pp. 222 and 223; Jan. 19, 1990.

Primary Examiner—Jeffrey A. Gaffin
Assistant Examiner—Thuy-Trang N. Huynh
Attorney, Agent, or Firm—Richard C. Woodbridge

[57] ABSTRACT

A method for compressing a block of input data of predetermined length into a compressed block of output which the use of an expanding input data window. The distance, position and length parameters of each matching string found in the expanding input data window are stored as a combined value which have a one-to-one correspondence to both the distance and length of any given point in the input data block. The combined values can be further encoded by use of a Huffman technique or any other appropriate statistical encoding technique. The combining of a matching string's distance and length parameters into a single value takes advantage of the correlation between the distance and length parameters. This correlation allows the single combined value of distance and length to be more efficiently encoded when using statistical encoding techniques. The technique is especially well adapted to compressing blocks of data of relatively small length. The organization of the code in the manner described results in higher compression and a faster implementation.

7 Claims, 6 Drawing Sheets

FIG. 9

```
move_string(l, d, p)
{
    switch(d) {
    case 0: /*string overlap*/
        switch(l) {
            move a byte at a time
        }
    case 1:
        switch(l) {
            move shorts, then byte
        }
        .
        .
        .
        defalut: /* distance > 4 */
            switch(l) {
                /* fastest method */
            }
    }
}
move_string(xi, p)
{
    switch(xi) {
        case 0:
            .
            .
        case MAX-LENGTH:
            move a byte at a time
        case MAX-LENGTH +1:
        case MAX-LENGTH +3:
            .
        case 2 * MAX-LENGTH -1:
            move shorts
            move odd byte
        case MAX-LENGTH +2:
        case MAX-LENGTH +4:
            .
        case 2 * MAX-LENGTH :
            move shorts
            .
            .
```

DATA COMPRESSION SYSTEM WITH EXPANDING WINDOW

BACKGROUND OF THE INVENTION

1. Field of the Invention

The invention relates to a data compression system which employs an expanding input data window and an additional transformation for the purpose of locating and encoding matching strings of data.

2. Description of Related Art

Data compression is becoming a very important requirement for high speed data transfer. This is especially true where large blocks of data have to be moved as is common when using the information superhighway. A useful survey of modern data compression techniques is found in an article entitled "Putting Data on a Diet" which appeared in the April, 1993 edition of the IEEE Spectrum, pages 36–39.

Many modern data compression techniques are based upon the LZ77 and LZ78 string matching methods invented by A. Lempel and J. Ziv in 1977 and 1978, respectively. LZ77 exploits the fact that words and phrases within a text stream are likely to be repeated. When they do occur, they may be encoded as a pointer to any previous occurrence plus a field indicating the length of the match. When there is no match, an escape bit may be used to indicate that a non-compressed literal character follows. The key to the operation of LZ77 is a sliding history buffer which stores the text most recently transmitted. When the buffer fills up, its oldest contents are discarded. Unfortunately, when data passes out of the sliding history buffer, it is no longer useful. The LZ78 technique attempts to overcome the LZ77 window size limitations by parsing all text seen so far into phrases were each phrase is the longest matching phrase seen previously plus one character. The LZ78 technique is limited by the fact that only a subset of all possible strings seen in the text so far can be encoded and the size of the encoded dictionary is of a fixed size.

The patent prior art discloses interesting compression techniques but none of which achieve the efficiency and transmission speed of the present invention. For example, U.S. Pat. Nos. 4,811,265, 4,890,326, 4,985,700 and 5,363,096 discuss, in other contexts, the combining of two or more values into another value as part of a general data processing scheme. Those values might be combined, for example, by direct multiplication or by vector multiplication or some other mathematical process. The concept of dividing values in a data processing and transmitting context is described in U.S. Pat. No. 4,930,265, among others. Encoding information into the remainder of a mathematical process is generally discussed in U.S. Pat. Nos. 4,122,440 and 5,208,593. The use of subsequent encoding techniques following LZ data compression is mentioned in U.S. Pat. No. 5,374,916.

The following U.S. Patents are believed to be of lesser, but still possible relevance, to the present inventive concepts: 4,701,745; 5,016,009; 5,126,739; 5,140,321; 5,281,967; 5,289,895; 5,309,526 and 5,339,076.

U.S. Pat. No. 5,369,605 entitled INCREMENTAL SEARCH CONTENT ADDRESSABLE MEMORY FOR INCREASED DATA COMPRESSION EFFICIENCY discloses the use of a conventional "sliding window" in the context of LZ77 compression.

Insofar as can be determined there only appears to be one prior art discussion of the concept of an expanding window. This technique known as LZB is briefly described in "Modeling for Text Compression" by T. Bell, J. Cleary and I. Witten. Most LZ77 derived techniques include at least two limitations on the strings which can be encoded first by the number of bytes that are matched and second by distance (e.g., bounded window). That is to say, they refer to a fixed-size sliding window approach. See, for example, the discussion in U.S. Pat. No. 4,701,745.

Insofar as understood, none of the foregoing prior art teaches the present invention which employs an expandable history window and is able to obtain significantly improved compression and transmission speeds not obtainable by other techniques.

SUMMARY OF THE INVENTION

Briefly described, the present invention comprises a compression method for converting a block of input data of a predetermined length into a compressed block of output data, based upon the replacement of a matching series of characters, i.e., strings, in the input data window, by code words, which correspond to (a) the relative matching string's location or distance d, (b) the number of matching characters, i.e., length, l, and (c) the current position of the input data p. The minimum successful matching string length is referred to as a threshold t, and is usually equal to two or three characters. These matching string parameters are transformed into a single value X which has a one-to-one correspondence to the d, and l values of the matching string and the current position p. The transformation of d, l, and p into a single X parameter causes a correlation between distance and length values for different matching strings and results in a plurality of X values with a frequency distribution superior to independent d and l values. There are many possible transformations of d, l, and p. To practically limit the size of an encoding table, the range of values for d and p are decomposed as follows:

$$d=2^{d_b}+d_r;\ d_b=[\log_2 d];\ d_r=d-2^{d_b}$$

$$p_b=[\log_2 p]+1$$

where $d_b$—is the largest integer, so that $2d^b \leq d$;

$d_r$—is a complement ($d_r < 2d^b$);

$p_b$—is an integer, so that $p_b > 1$, and $p_b > d_b$.

The $d_b$ value is combined with l and $p_b$ to produce a one-to-one value X, and $d_r$ is stored directly (using the next $d_b$ bits). The transformation for the example invention is then as follows:

$$X=p_b(l-t)+d_b$$

If no matching characters are found, or the length of the matching string is less than the size of a resulting code word, then the character at the current position is stored in the compressed output with a flag, i.e., escape bit, which tells the decompressor to decode a character. Both stored characters, and matching string code words, can be secondarily encoded using adaptive BSTW encoding, static or dynamic Huffman techniques, or arithmetic encoding. The overall technique produces improved compression and faster data transmission speeds over other techniques known in the prior art and is especially efficient for blocks of data of relatively small lengths, e.g., 0.5–8.0 K bytes.

BRIEF DESCRIPTION OF THE DRAWINGS

FIG. 9 are code samples that illustrate differences in implementation efficiency.

DETAILED DESCRIPTION OF THE INVENTION

During the course of this description like numbers will be used to identify like elements according to the different views that illustrate the invention.

For each position in the input block, the LZX compressor of the preferred embodiment of the invention keeps track of all bytes previously seen. This is used to find the longest match with the string at current the position. In effect, the compressor uses an Expanding Window, i.e. a window whose size is equal to the number of previously processed bytes in the input block. This is best understood by referring to FIG. 1.

N=the number of characters in an input block d=relative matching string address t=threshold p=the current position in the input block l=string length It is then possible to write the following set of expressions:

$$0 \leq p \leq N-1$$

$$1 \leq d < p$$

$$1 \leq p \leq N-t$$

$$t \leq 1 \leq N-p-1$$

The limits above (which formalize the Expanding Window approach) are used in the LZX technique of the present invention to estimate the ranges of variables l and d, which are necessary to build an effective encoding scheme.

Unlike standard LZ77 and LZ78 schemes, the LZX technique of the present invention is most efficient at compressing blocks of data of relatively small predetermined length (usually 0.5–8.0 K bytes). The sliding window approach (which is the main feature of LZ77 prior art compressors) cannot be used effectively when working with such small amounts of input data. If the size of the sliding window is defined to be larger than the amount of data to be compressed, then this will result in the bit space for the encoding being much larger than required, and vice versa, if the size of the sliding window is much smaller than the input data, then any matching strings with distances greater than the size of the sliding window cannot be encoded.

Figure 2:
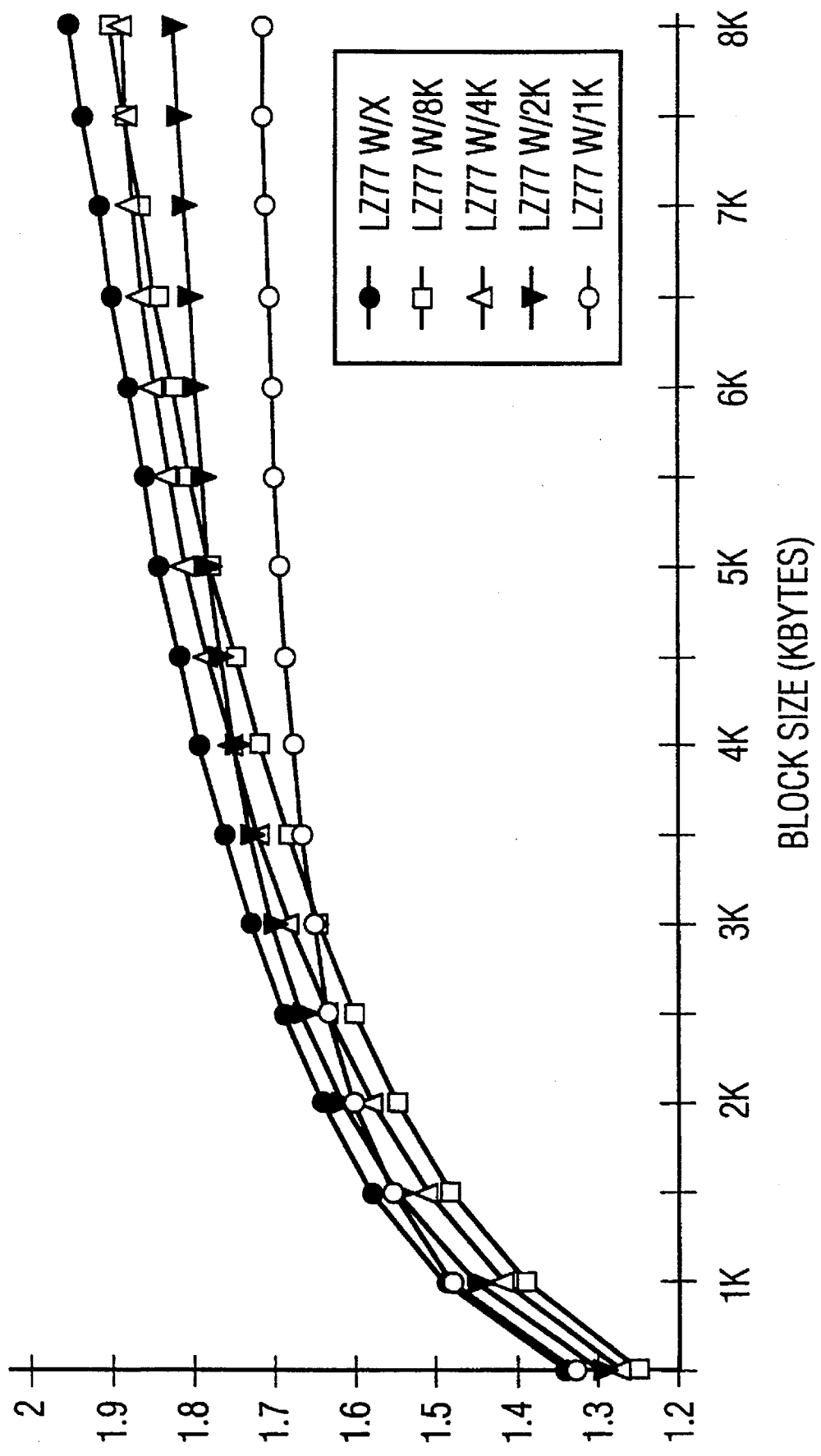
FIG. 2 illustrates the compression system using an LZ77 based compressor with the expanding window approach of the preferred embodiment of the present invention.

Instead, the LZX technique of the present invention uses an Expanding Window approach, which does not have the disadvantages as described previously for the standard sliding window approach. A typical example illustrating the effects of using the Expanding Window approach is shown in FIG. 2. Tests were carried out with four (4) techniques: 3 standard LZ77 compressors with window size of 1 K–8 K (identified as LZ77 W/1–8 K respectively) and the same LZ77-based compressor with the Expanding Window approach (identified as LZ77 W/X). The four techniques were run on the file book2 from the standard Calgary Text Compression corpus.

The LZX Expanding Window technique of the preferred embodiment of the present invention leads to a more efficient implementation than the sliding window approach, and therefore provides additional benefits in terms of compression and decompression speeds especially for relatively small blocks of data.

Figure 1:
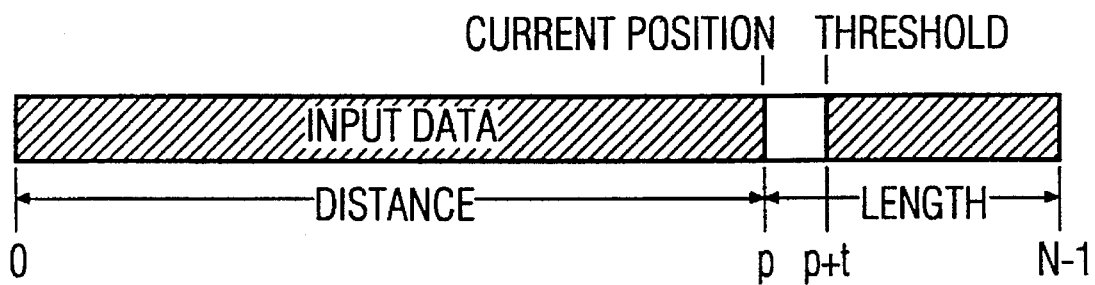
FIG. 1 illustrates the range of the distance d and length l for a given position p in the input data.
Figure 3:
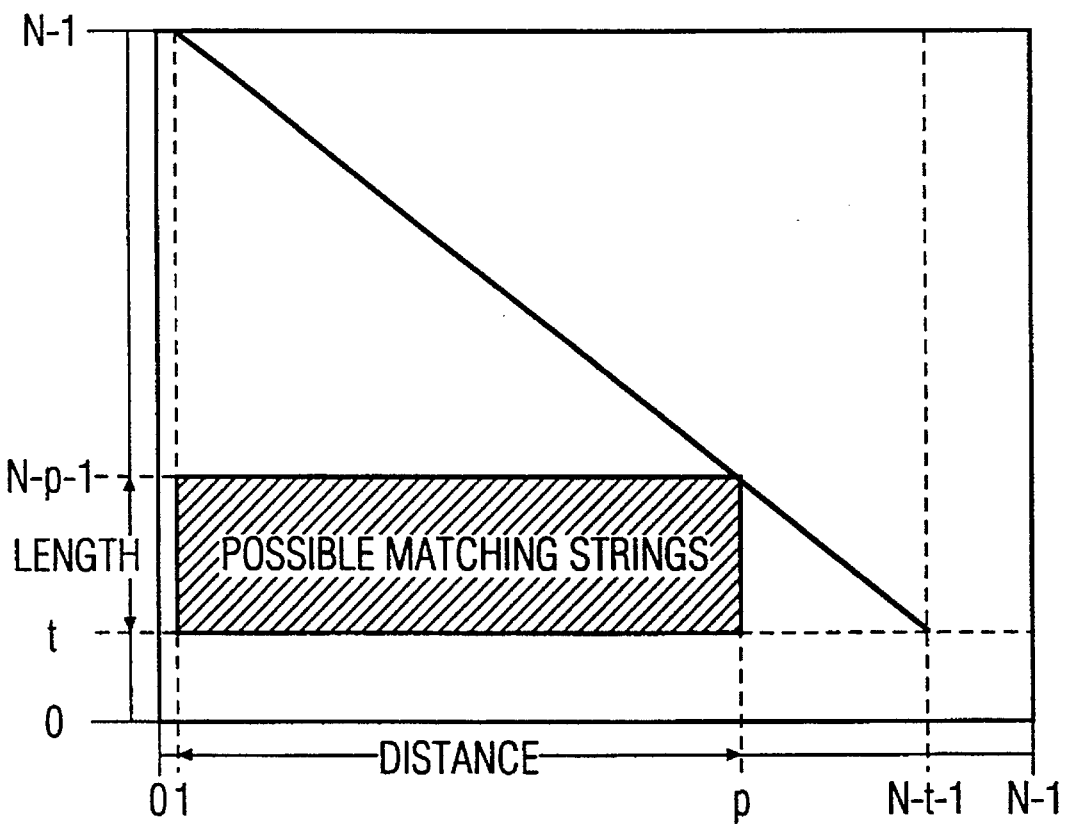
FIG. 3 is a diagram illustrating the relationship between length and position for possible matching strings.

According to the LZX technique of the present invention, a matching string to be encoded can be represented by two values: distance d, and length l, limits of which in the LZX technique are dependent on the current position p in input block (see FIG. 1). In other words, for each position p in the LZX technique, there may occur:

$$x \max = (d \max - d \min)(l \max - l \min) = (p-1)(N-p-1-t)$$

matching strings as shown in FIG. 3.

Therefore, to encode a matching string it is possible to either store the string's distance and length, or store some combined value, which has a one-to-one correspondence to both the distance and length at any given position in the input block. In both cases, the resulting values can be considered as probabilitical sources, and can be further encoded by using a Huffman technique or any other statistical encoding technique. Combining a matching string's distance and length parameters into a single value allows for the effects of a correlation between the distance and length parameters. This correlation has previously not been appreciated or exploited. Using separate distance and lengths can not take into account this correlation.

Figure 4:
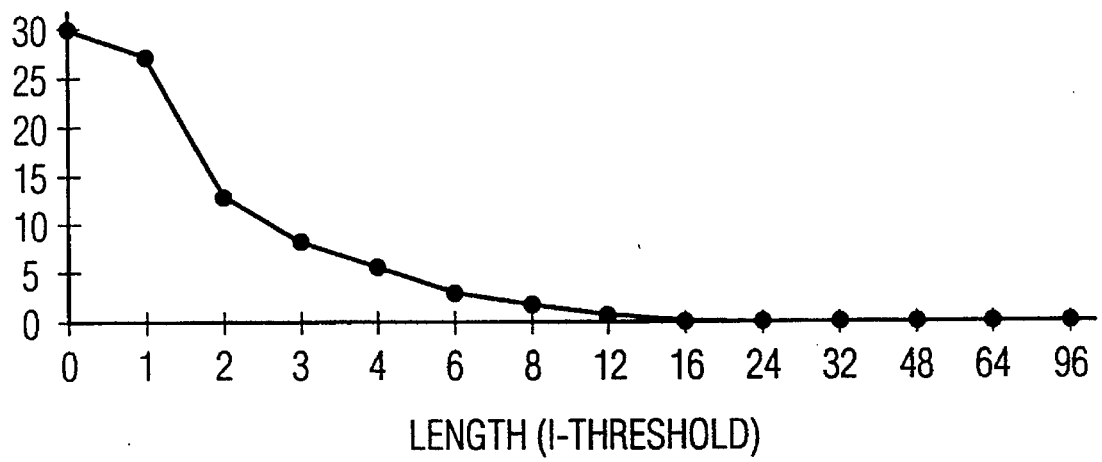
FIG. 4 illustrates possible length distributions.
Figure 5:
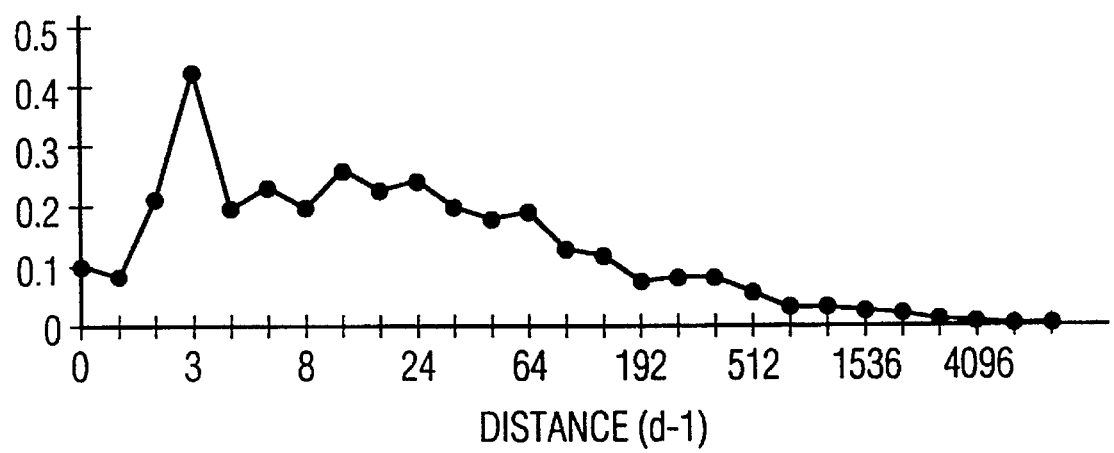
FIG. 5 illustrates possible distance distributions.
Figure 6:
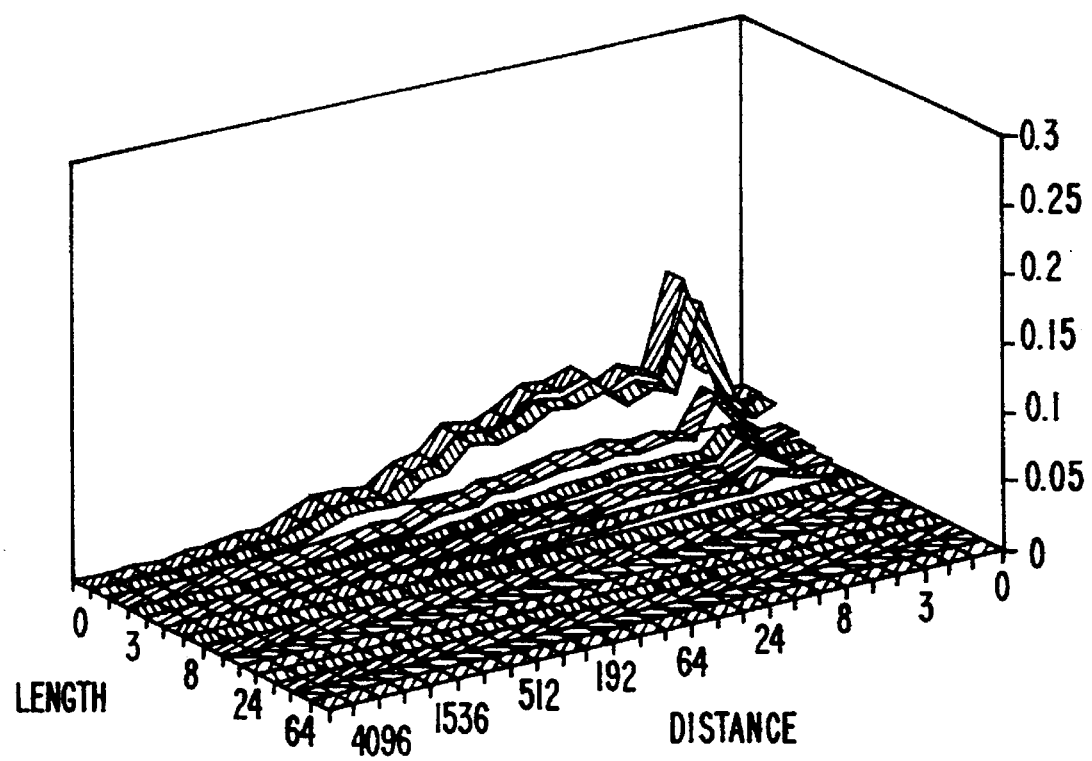
FIG. 6 illustrates the expected, flat distribution of matching strings.

The following graphs illustrate the advantages that full context encoding affords. FIG. 4 and 5 show the overall distributions of distance and length values of string matches using a standard LZ77 based technique when run on the file book2 from the Calgary Text Compression Corpus. A LZ77 implementation could use this distribution data to generate two separate Huffman encoding trees for the distance and length distributions respectively to reduce the size of the output code. FIG. 6 represents the combined distribution of both the distance and length parameters as illustrated in FIGS. 4 and 5. That is, the effective distribution of an algorithm encoding distance and length separately can be expressed as a plain distribution as set forth below:

$$P(l,d) = P(l) \cdot P(d)$$

Figure 7:
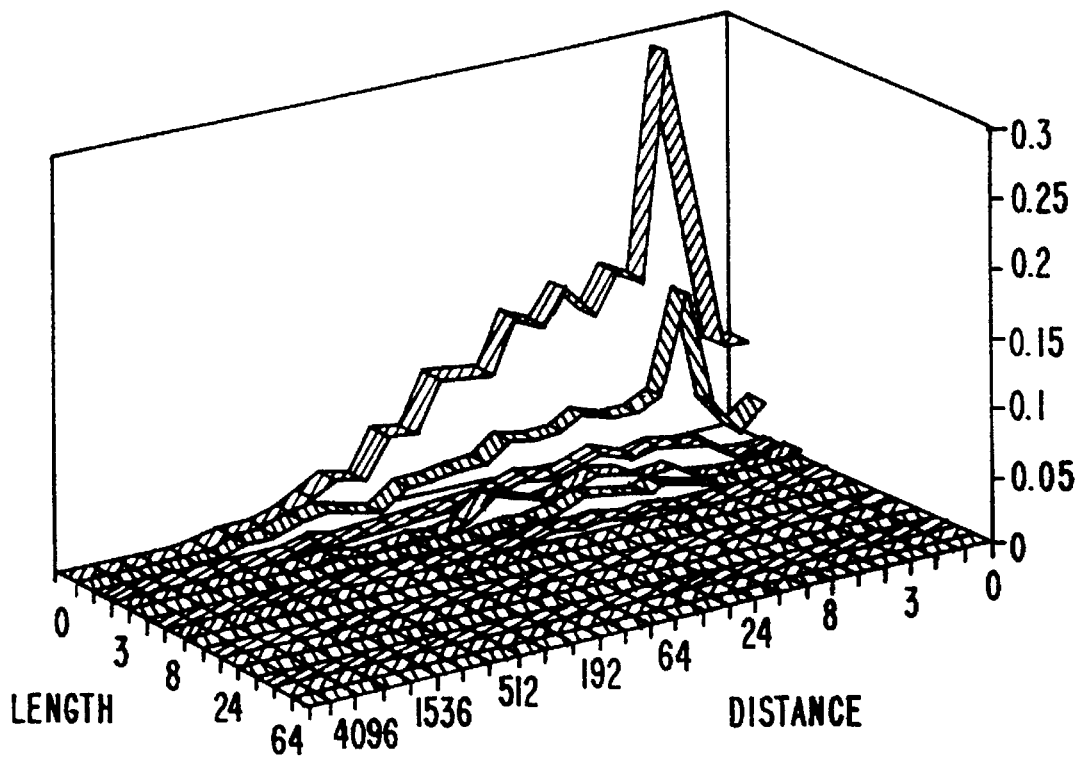
FIG. 7 illustrates the actual distribution of matching strings.

FIG. 6 represents the above distribution. FIG. 7 represents the probability distribution of distance and lengths for the same input as in FIGS. 4–6 when using full context encoding. That is, in FIG. 7, the LZ77 technique has distance and length values combined into a single full context value. Note that the distribution of the matching string values are more scattered and that the probability of 2 and 3 character string matches with short distances (<8) are twice as large as the expected values based on the plain distribution. This better probability distribution results because of the correlation between lengths and distances. A full context distribution can be used to create a much more effective Huffman encoding tree resulting in fewer bits in the output stream and therefore an increased compression ratio. In the book2 example being used here, the resulting compression ratio has been increased by approximately 0.78 bits/string.

The LZX technique according to the preferred embodiment of the present invention uses a full-context encoding method as described. For each string that is matched in the input text a single code is generated. This value $\xi$ has a one-to-one correspondence to both the matching string's distance and length parameters:

$$\xi = \xi(l, d[, p]); \ l = \xi_l^{-1}(\xi[, p]); \ d = \xi_d^{-1}(\xi[, p])$$

where parameter p is used for an Expanding Window approach. Two simple examples of such a transformation (called $\xi$ transformations) are given below:

FORWARD TRANSFORMATION $$\xi = (l - l \ min)(d \ max - d \ min + 1) + (d - d \ min) = (l - t)p + d - 1$$

BACKWARD TRANSFORMATION $$d = \xi \bmod (d \ max - d \ min + 1) + d \ min = \xi \bmod p + 1$$

$$l = \xi / (d \ max - d \ min + 1) + l \ min = \xi / p + t$$

and:
FORWARD TRANSFORMATION $$\xi = (d - d \ min)(l \ max - l - min + 1) + (l - l \ min) = (d - 1)(N - p - t) + l - t$$

BACKWARD TRANSFORMATION $$d = \xi \bmod (l \ max - l \ min + 1) + d \ min = \xi \bmod (N - p - t) + 1$$

$$l = \xi / (l \ max - l \ min + 1) + l \ min = \xi / (N - p - t) + t$$

The resulting $\xi$ values take into account the correlation between a matching string's distance and length parameters and has a frequency distribution which allows for more efficient encoding.

A modified transformation is also possible. In most cases, it is useful to reduce the range of distance and length values to encode so that the size of statistical encoding tables can be reduced. A standard approach to limit this range (used in almost all AR002-derivative archivers), is to split the matching strings' distance and length parameters based on the following decomposition's:

$$d = \alpha^{d_b} + d_r; \ d_b = [\log_\alpha d]; \ d_r = d - \alpha^{d_b},$$

where $d_b$—is the largest integer, so that $\alpha^{d_b} \leq d$;
where $\alpha$ and $\beta$, are base coefficients (usually 1.41..4), $d_b$ and $l_b$ are the numbers to encode using a Huffman (or similar) technique, and the complements, $d_r$ and $l_r$ are values to be stored directly. Once $d_b$ and $l_b$ have been determined, the number of bits required to store their complements, $d_r$ and $l_r$ can be calculated.

The same technique can be applied to the string indexes ($\xi$ values) so that the modified formulae for $\xi$-transformations can be rewritten as follows:

$$\xi = \gamma^{\xi_1} + \xi_2; \ \xi_{1,2}(l, d[, p], \gamma);$$

where functions $\xi_1(\ )$, and $\xi_2(\ )$ can be derived from the expected (universal) [ld[p]] probability distributions, which also limits the range of possible $\xi_1$ values and hence the size of any encoding tree.

The following describes the benefits derived from the technique of the present LZX invention over prior art techniques. Full-context encoding, according to the present invention, takes into account the effects of a correlation previously unrecognized between matching strings' lengths and distances and therefore results in a more efficient encoding. This translates into a better compression ratio.

Figure 8:
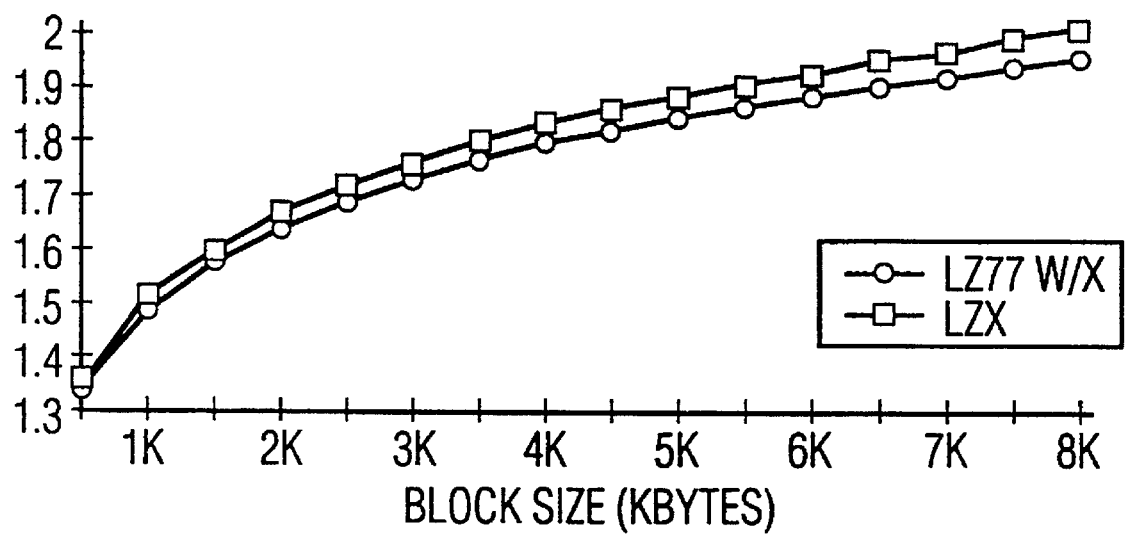
FIG. 8 illustrates the ultimate relationship between the LZ77 compression engine with an expanded window and the LZX embodiment.

A typical example of the effects of using Full Context Encoding is shown in FIG. 8. Tests were carried out with two algorithms: LZ77 with an expanding window using a separate distance/length Huffman encoding technique, and the same expanding window algorithm with a modified $\xi$-transformation with the range of the distance parameter d being reduced by having $\alpha$ equal to 2. Algorithms were run on file book2 from standard Calgary Text Compression corpus.

Another major benefit of the $\xi$- transformation is that the resulting codes can be encoded by one Huffman tree, so that encoding can be twice as fast compared to two Huffman trees needed to encode separate distance and lengths. In addition, by using the $\xi$- transformation, it is possible to organize the encoder/decoder's code so that each class of matching string (i.e. strings with the same $\xi_1$ values), will be processed by a separate section of code which can be optimized for the corresponding string's parameters (derived from each $\xi_1$ value). That is, a single $\xi_1$ value encodes all the information to determine the fastest possible way to copy the matching string. For example, if it is known that the matching string can not overlap with the current position, then there is no need to check for this possibility. To determine whether overlapping is possible with separate distance and lengths requires a significantly more expensive check. The code samples in FIG. 9 illustrate the difference in implementation efficiency.

This organization of the code based on the $\xi_1$ values results in a faster implementation as only a single jump table is required to implement the fastest possible method of moving the matching string for a given hardware architecture. Separate distance and length encodings require two levels of jump tables for each call to the move_string function. Since the move_string function is the most executed function for decompression, an increase in decompression speeds can be realized.

While the foregoing has been described with reference to the preferred embodiment thereof, it will be appreciated by those of ordinary skill in the art that modifications may be made to the steps and implementation of the LZX technique without departing from the spirit and scope of the invention as a whole.

I claim:

1. A method for compressing data including N characters in an input block where p is the current position of a character in said block, d is the distance of a matching string in a window of input data, t is a threshold, and l is the length of a given string, said method comprising the steps of:

a. determining the distance d of a character string in said block from a substantially identical string in said window of input data;

b. performing a transformation that combines d, l, and p of said character string into a single value X; and, c. repeating steps (a) and (b) above until input data is exhausted, thereby producing a plurality of values $X_i$ to form a string of compressed data wherein the frequency distribution of the $X_i$ values are such that they can be more efficiently encoded by statistical encoding as opposed to encoding $d_i$ and $l_i$ values separately.

2. The method of claim 1 wherein the size of said window of input data is expandable in relation to the amount of previously compressed data.

3. The method of claim 2 wherein the size of said expandable window is substantially limited by the following relationships:

$$0 \leq p \leq N-1$$

$$1 \leq d < p$$

$$1 \leq p \leq N-t$$

$$t \leq 1 \leq N-p-1.$$

4. The method of claim 3 wherein the value of each $X_i$ determined in step (b) above is as follows:

$$P_b = [\log_2 p] + 1$$

$$d = 2^{d_b} + d_r;\ d_b = [\log_2 d];\ d_r d = 2^{d_b}$$

$$X = p_b(l-t) + d_b$$

where:

$d_b$—is the largest integer, so that $2d^b \leq d$;

$d_r$—is a complement ($d_r < 2d^b$);

$p_b$—is an integer, so that $p_b > 1$, and $p_b > d_b$.

5. The method of claim 4 further including the step of:

d. Further encoding said values $X_i$ determined in step (b).

6. The method of claim 5 wherein said further encoding step (d) comprises encoding said values $X_i$ by Huffman encoding.

7. The method of claim 6 wherein if a string of length $l > t$ is not found in said expandable input data window then its value is recorded as a literal value.

* * * * *